: US008778751B2

United States Patent
Poelzl

(10) Patent No.: US 8,778,751 B2
(45) Date of Patent: Jul. 15, 2014

(54) METHOD FOR PRODUCING A STRUCTURE ELEMENT AND SEMICONDUCTOR COMPONENT COMPRISING A STRUCTURE ELEMENT

(75) Inventor: Martin Poelzl, Ossiach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/235,550

(22) Filed: Sep. 19, 2011

(65) Prior Publication Data
US 2012/0068260 A1   Mar. 22, 2012

(30) Foreign Application Priority Data

Sep. 21, 2010   (DE) .................. 10 2010 046 213

(51) Int. Cl.
| | |
|---|---|
| *H01L 21/8238* | (2006.01) |
| *H01L 29/423* | (2006.01) |
| *H01L 29/08* | (2006.01) |
| *H01L 29/10* | (2006.01) |
| *H01L 29/417* | (2006.01) |
| *H01L 29/66* | (2006.01) |
| *H01L 29/78* | (2006.01) |
| *H01L 21/762* | (2006.01) |

(52) U.S. Cl.
CPC ........ *H01L 29/4236* (2013.01); *H01L 29/0847* (2013.01); *H01L 29/1095* (2013.01); *H01L 29/41766* (2013.01); *H01L 29/66734* (2013.01); *H01L 29/7813* (2013.01); *H01L 29/66681* (2013.01); *H01L 21/76286* (2013.01)
USPC ........... 438/221; 438/270; 438/361; 438/435; 438/437

(58) Field of Classification Search
CPC ............ H01L 29/0847; H01L 29/1095; H01L 29/41766; H01L 29/4236; H01L 29/66734; H01L 29/7813; H01L 29/66681; H01L 21/76286
USPC .......................... 438/270, 221, 361, 435, 437
See application file for complete search history.

(56) References Cited

U.S. PATENT DOCUMENTS

| | | | | |
|---|---|---|---|---|
| 5,015,602 | A | * | 5/1991 | Van Der Plas et al. ....... 438/424 |
| 5,804,490 | A | | 9/1998 | Fiegl et al. |
| 5,895,951 | A | | 4/1999 | So et al. |
| 5,909,626 | A | * | 6/1999 | Kobayashi .................... 438/406 |

(Continued)

FOREIGN PATENT DOCUMENTS

| | | |
|---|---|---|
| DE | 4042163 A1 | 9/1991 |
| DE | 10 2004 057 237 A1 | 6/2006 |

(Continued)

*Primary Examiner* — Bac Au
(74) *Attorney, Agent, or Firm* — Murphy, Bilak & Homiller, PLLC

(57) ABSTRACT

A semiconductor component includes a semiconductor body having a surface and a cutout in the semiconductor body. The cutout extends from the surface of the semiconductor body into the semiconductor body in a direction perpendicular to the surface. The cutout has a base and at least one sidewall. The component further includes a layer on the surface of the semiconductor body and in the cutout. The layer forms a well above the cutout. The well has a well base, a well edge and at least one well sidewall. The at least one well sidewall forms an angle α in the range of 20° to 80° with respect to the surface of the semiconductor body. The layer has at least one edge which, proceeding from the well edge, extends in the direction of the surface of the semiconductor body.

12 Claims, 3 Drawing Sheets

(56) References Cited

U.S. PATENT DOCUMENTS

| | | | |
|---|---|---|---|
| 6,015,737 A * | 1/2000 | Tokura et al. | 438/270 |
| 6,017,803 A * | 1/2000 | Wong | 438/430 |
| 6,084,268 A * | 7/2000 | de Fresart et al. | 257/342 |
| 6,168,996 B1 * | 1/2001 | Numazawa et al. | 438/270 |
| 6,211,018 B1 | 4/2001 | Nam et al. | |
| 6,265,302 B1 * | 7/2001 | Lim et al. | 438/622 |
| 6,346,469 B1 * | 2/2002 | Greer | 438/614 |
| 6,436,789 B2 * | 8/2002 | Sawamura | 438/424 |
| 6,489,652 B1 * | 12/2002 | Jeon et al. | 257/330 |
| 6,528,389 B1 * | 3/2003 | Allman et al. | 438/424 |
| 6,916,745 B2 | 7/2005 | Herrick et al. | |
| 7,375,029 B2 | 5/2008 | Poelzl | |
| 7,595,242 B2 * | 9/2009 | Nakazawa et al. | 438/269 |
| 7,745,303 B2 * | 6/2010 | Yamamoto | 438/424 |
| 7,851,349 B2 | 12/2010 | Rieger et al. | |
| 2002/0074585 A1 | 6/2002 | Tsang et al. | |
| 2005/0009263 A1 * | 1/2005 | Yeo et al. | 438/221 |
| 2005/0196935 A1 * | 9/2005 | Ishitsuka et al. | 438/437 |
| 2006/0027862 A1 | 2/2006 | Nakazawa et al. | |
| 2006/0081918 A1 | 4/2006 | Hsu | |
| 2006/0141739 A1 | 6/2006 | Poelzl | |
| 2006/0286738 A1 | 12/2006 | Wei | |
| 2006/0286739 A1 * | 12/2006 | Rossi et al. | 438/221 |
| 2008/0090357 A1 | 4/2008 | Tai et al. | |
| 2009/0026531 A1 | 1/2009 | Poelzl | |
| 2009/0309156 A1 | 12/2009 | Darwish et al. | |
| 2011/0220990 A1 | 9/2011 | Chang et al. | |

FOREIGN PATENT DOCUMENTS

| | | |
|---|---|---|
| DE | 102004057237 A1 | 6/2006 |
| DE | 102010046213 B3 | 2/2012 |
| WO | 2008121991 A1 | 10/2008 |

* cited by examiner

METHOD FOR PRODUCING A STRUCTURE ELEMENT AND SEMICONDUCTOR COMPONENT COMPRISING A STRUCTURE ELEMENT

SUMMARY

This application claims priority to German Patent Application No. 10 2010 046 213.6 filed on 21 Sep. 2010, the content of said application incorporated herein by reference in its entirety.

BACKGROUND

The semiconductor industry has always strived to achieve smaller feature sizes. For this purpose, it is necessary to reduce the size of the structure elements required. In this case, however, the tolerance limits must not be disregarded. Self-aligned production methods are increasingly being used for this purpose, and make it possible to meet the requirements for smaller structures while at the same time fulfilling tolerance ranges to be complied with.

Examples from power semiconductor technology for self-aligned structure elements are known from DE 102004057237 A1, which describes contact holes for channel/source regions in the case of gate trench transistors. The contact holes are produced in mesa regions between two trenches with a defined, small distance from the trenches. This can be done here either with the aid of so-called "spacers" or by means of an oxide layer—produced by thermal oxidation—as a mask for the contact hole etching. However, the tolerances are relatively large in the case of "spacers" and, in the case of the oxide masks, particularly in the case of gate trench transistors, the gate trench has to be produced with a greater depth in order to be able to carry out the thermal oxidation.

SUMMARY

Embodiments described herein provide a method for producing a structure element with small tolerance limits and a self-aligned structure element in a semiconductor component.

Embodiments of the method generally include the following features: providing a semiconductor body having a surface; producing a cutout at the surface, wherein the cutout extends from the surface of the semiconductor body into the semiconductor body in a direction perpendicular to the surface, wherein the cutout has a base and at least one sidewall; producing a first auxiliary layer on the surface and in the cutout in such a way that the first auxiliary layer forms a well above the cutout, wherein the well has a well base and at least one well sidewall which forms an angle $\alpha$ in the range of 20° to 80° with respect to the surface of the semiconductor body; producing a second auxiliary layer within the well at the well base and at the at least one well sidewall, wherein the first auxiliary layer and the second auxiliary layer form a common surface at an identical surface level, wherein the second auxiliary layer is produced from a different material from the first auxiliary layer; and selectively removing the regions of the first auxiliary layer which are not covered by the second auxiliary layer.

The setting of the angle $\alpha$ of the well sidewalls can be set very precisely. By means of the angle $\alpha$, a distance extending from the cutout over the surface of the semiconductor body can also be defined very precisely. On account of the different materials of the first and second auxiliary layers, by means of the selective removal of the first auxiliary layer, on account of the protective effect of the second auxiliary layer on the first auxiliary layer, the width and therefore also the lateral overlap of the first auxiliary layer over the surface of the semiconductor body can be produced very precisely with the aid of the set angle $\alpha$. In this case, the choice of the angle $\alpha$ in conjunction with the thickness of the first auxiliary layer on the surface of the semiconductor body allows the setting of a very small lateral overlap of the first auxiliary layer over the surface of the semiconductor body. This therefore constitutes a self-aligned method with small tolerance limits, whereby spacings with respect to the cutout in the semiconductor body can be set precisely and can be kept very small. In particular, a structure element produced according to the method described is suitable for use as a mask layer for subsequent further processing of the semiconductor body for a semiconductor component, such as, for example, as a mask layer in an etching or implantation method.

One development of the method provides for the first auxiliary layer to be produced by an HDP process. An HDP process is a method for chemically depositing a material from the gas phase which at the same time has a sputtering effect on the deposited material, that is to say that the deposited material is also removed again by impinging particles, in particular at occurring edges of the deposited material, but the deposition rate is higher than the sputtering rate. As a result, therefore, layer growth arises overall in an HDP process. Edges in the deposited material acquire a flattening, however, thus giving rise to an oblique surface of the deposited material at the edge, in particular with an angle in the range of 35° to 50° with respect to a main surface.

In an HDP process, in particular, it may therefore be necessary to protect an edge already present, such as, for example, the edge of the cutout with respect to the surface of the semiconductor body, against removal on account of the sputtering effect of the HDP process. For this purpose, in one embodiment, for example, before the first auxiliary layer is produced, a continuous protective layer is produced on the surface of the semiconductor body and in the cutout.

One development of the method provides for the second auxiliary layer to be produced by deposition of the different material in the well. Consequently, the well sidewalls are maintained in their original form and, consequently, in subsequent method steps, too, still have the same dimensions, in particular the same angle $\alpha$, as before the deposition of the second auxiliary layer.

It is a particularly simple production variant if the second auxiliary layer completely fills the well. Particularly if the common surface of first and second auxiliary layers is produced by a CMP method, firstly the second auxiliary layer can be produced over the whole area in the well and also above the first auxiliary layer and, subsequently, by means of a uniform removal, the common surface of first and second auxiliary layers can be set very exactly at an identical surface level. In the case of a CMP processor used, the removal ensues firstly mechanically and then chemically in the end phase, wherein the chemical removal can be ended very exactly on the first auxiliary layer.

One embodiment of the method provides for the second auxiliary layer to be removed from the well after the process of selectively removing the regions of the first auxiliary layer which are not covered by the second auxiliary layer.

That can be realized particularly if the second auxiliary layer is removed during the production of a trench into the semiconductor body. For example when using a material for the second auxiliary layer which can be etched using an etching medium identical to that used for the semiconductor body, the removal of the second auxiliary layer during a trench etch into the semiconductor body is feasible without additional outlay. In particular, in this case, the first auxiliary layer, which is produced from a different material, can serve as a mask for the trench etching process.

An exemplary embodiment of a semiconductor component comprises the following structural features: a semiconductor body having a surface; a cutout in the semiconductor body, wherein the cutout extends from the surface of the semiconductor body into the semiconductor body in a direction perpendicular to the surface, and wherein the cutout has a base and at least one sidewall; a layer on the surface of the semiconductor body and in the cutout, wherein the layer forms a well above the cutout, the well having a well base and at least one well sidewall, wherein the at least one well sidewall forms an angle $\alpha$ in the range of 20° to 80° with respect to the surface of the semiconductor body, and wherein the layer has at least one edge 22 which, proceeding from the well edge, extends in the direction of the surface of the semiconductor body.

The layer at the surface of the semiconductor body is dimensioned in a self-aligned fashion by the angle $\alpha$ of the well sidewall and has only a very small tolerance range.

In particular, it is thus possible to provide a semiconductor element wherein the layer covers the surface of the semiconductor body proceeding from the sidewall of the cutout over a distance x in the range of from 50 nm to 150 nm.

One exemplary embodiment of the semiconductor component can provide for a trench to be formed in the semiconductor body, the trench having at least one trench sidewall which, proceeding from the edge of the layer, extends into the semiconductor body.

In this variant, the layer can be used as a mask layer for the trench etch, or subsequent method steps, such as e.g. implantations, which enables very precise feature sizes, in particular a very precise and small distance between the cutout and the trench produced.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Exemplary embodiments are explained in greater detail below, with reference to the accompanying figures. However, the invention is not restricted to the embodiments specifically described, but rather can be modified and altered in a suitable manner. It lies within the scope of the invention to suitably combine individual features and feature combinations of one embodiment with features and feature combinations of another embodiment in order to arrive at further embodiments.

Figure 1A:
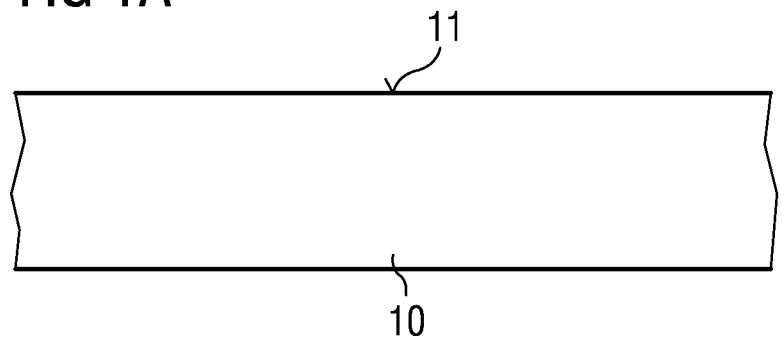
FIG. 1 shows, in schematic cross-sectional views 1a to 1e, individual, exemplary method steps of a method for producing a structure element.

FIG. 1a shows a semiconductor body 10 having a first surface 11. The semiconductor body 10 can be produced from any known semiconductor material, in particular from silicon. Depending on the application, the semiconductor body 10 can be n-doped or p-doped. In particular, the semiconductor body 10 can also comprise a semiconductor substrate with an epitaxial layer deposited thereon, wherein the semiconductor substrate and the epitaxial layer can be doped differently. The epitaxial layer could then have the surface 11. For the exemplary use of the semiconductor body 10 in a power semiconductor component, that is to say in a semiconductor component wherein voltages of up to hundreds or even thousands of volts can be present between two electrodes, such a semiconductor body 10 is generally composed of a highly doped semiconductor substrate and a lightly doped epitaxial layer deposited thereon.

Figure 1B:
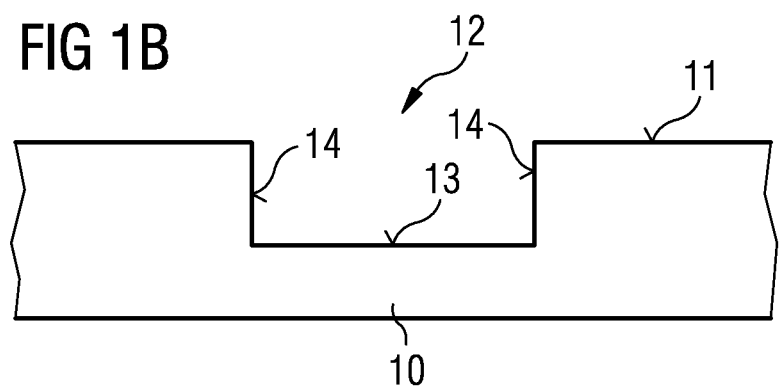

FIG. 1b shows a cutout 12 produced at the surface 11 of the semiconductor body 10. In this case, the cutout 12 extends from the surface 11 of the semiconductor body 10 into the semiconductor body 10 in a direction perpendicular to the surface 11. The cutout has a base 13 and sidewalls 14.

The cutout 12, which can have a depth of from a few nanometers to a number of micrometers, can be a trench extending in an elongated fashion into the semiconductor body 10, or else a punctiform depression in the semiconductor body 10, wherein the form of such a punctiform depression can be round, square or hexagonal, for example, in plan view. Further functional elements of a semiconductor component can also be formed in the cutout 12. By way of example, electrodes such as occur in power semiconductor components, for example, can also be produced in the cutout 12. In these cases, by way of example, a channel control electrode (gate electrode) is formed in the cutout 12. In addition, even further electrodes such as, for example, field plates can also be produced in the cutout 12.

Figure 1C:
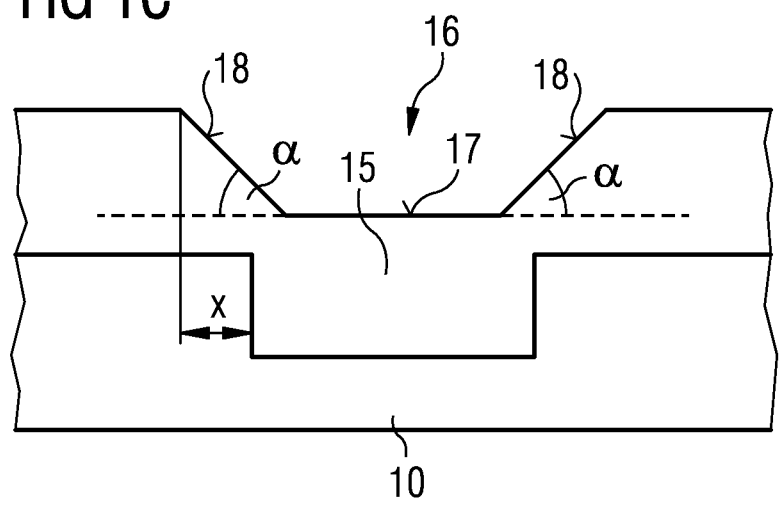

FIG. 1c shows the structure after a first auxiliary layer 15 is produced on the surface 11 and in the cutout 12. In this case, the first auxiliary layer 15 itself forms a well 16 above the cutout 12, wherein the well 16 has a well base 17 and well sidewalls 18. In this case, the well sidewalls 18 form an angle $\alpha$ with respect to the surface 11 of the semiconductor body 10. The angle $\alpha$ can have a value in the range of 20° to 80°.

In this case, the first auxiliary layer 15 is produced from a different material with respect to the material of the semiconductor body 10. By way of example, the material of the first auxiliary layer 15 can be a dielectric. In particular, an oxide such as $SiO_2$, for example, is suitable in this case.

In this case, production is effected in such a way that the well 16 is formed above the cutout 12 and the desired angle $\alpha$ is established. In this case, the well sidewalls 18 extend over the edge of the sidewalls 14 of the cutout 12 and over a defined distance x of the surface 11 of the semiconductor body 10. The distance x is defined by way of the angle $\alpha$ and can be between 50 nm and 150 nm, for example. In this case, the distance x is also dependent on the layer thickness of the auxiliary layer 15. In this case, typical layer thicknesses are in the range of 100 nm to 500 nm, for example.

The first auxiliary layer 15 can be produced in the cutout 12 either directly at the base 13 or else on functional elements already present in the cutout 12, such as on the gate electrode already mentioned, for example.

The first auxiliary layer 15 can be produced by means of an HDP (High Density Plasma) process, for example. Such a process is a combination of a deposition method from the gas phase and a sputtering method wherein material is removed, in particular at edges present. By means of such an HDP process, the formation of the oblique well sidewalls 18 with the angle α can be realized in a particularly simple manner by the setting of the sputtering power and deposition rates. Typical values of the sputtering power are approximately 1000 watts, for example. In this case, the surface present is treated for example with arsenic for approximately 82 seconds, oxygen for approximately 234 seconds or $SiH_4$ for approximately 100 seconds.

Figure 1D:
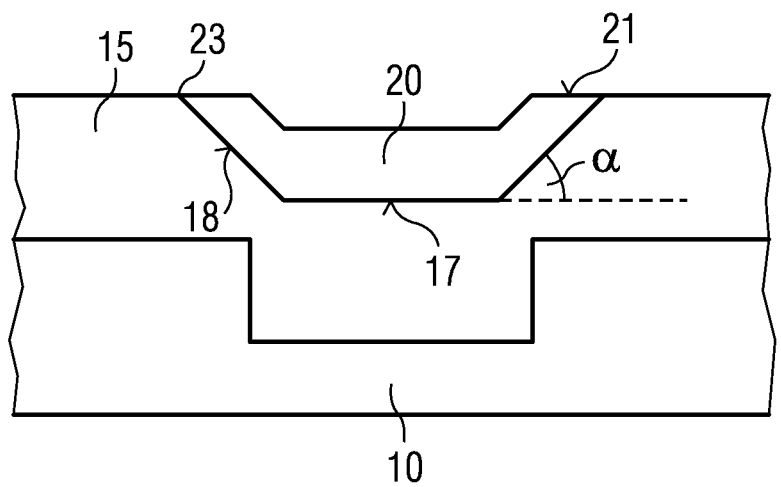

FIG. 1d shows a second auxiliary layer 20 produced in the well 16. In this case, the second auxiliary layer 20 can firstly be produced over the whole area on the well base 17, the well sidewalls 18 and at a surface of the first auxiliary layer 15. For example this can be done by means of a process of depositing a different material with respect to the material of the first auxiliary layer 15 from the gas phase. By way of example, doped or undoped polysilicon or a nitride such as silicon nitride, for example, is appropriate as material for the second auxiliary layer 20.

After this deposition over the whole area, the second auxiliary layer 20 is removed from the surface of the first auxiliary layer 15, such that the second auxiliary layer 20 remains only in the well 16. The removal of the second auxiliary layer 20 from the surface of the first auxiliary layer 15 can be effected by a Chemical Mechanical Polishing method (CMP method), for example. In this case, in a first method step, the second auxiliary layer 20 is removed to just above the surface of the first auxiliary layer 15 mechanically, such as by means of grinding and lapping, for example. In a further method step during CMP, the second auxiliary layer 20 is then finally removed completely from the surface of the first auxiliary layer 20 by means of a chemical etching step, as a result of which a common surface 21 of the first auxiliary layer 15 and of the second auxiliary layer 20 remaining in the well 16 is formed at an identical surface level and a transition between first auxiliary layer 15 and second auxiliary layer 20 arises at the well edge 23 at the surface 21. In this case, the surface of the first auxiliary layer 15 can serve as an etch stop. Alternatively, the second auxiliary layer 20 can also be removed by means of an isotropic etching method.

The remaining second auxiliary layer 20 can fill the well 16 only partly (as illustrated) or else the well 16 can be completely filled by the second auxiliary layer 20. In that case, the common surface 21 illustrated in FIG. 1d would be formed continuously over the entire well 16.

Figure 1E:
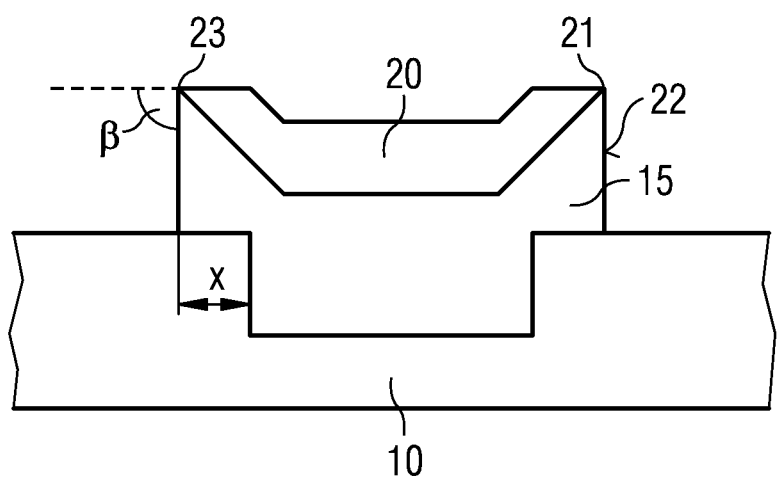
Figure 1E:
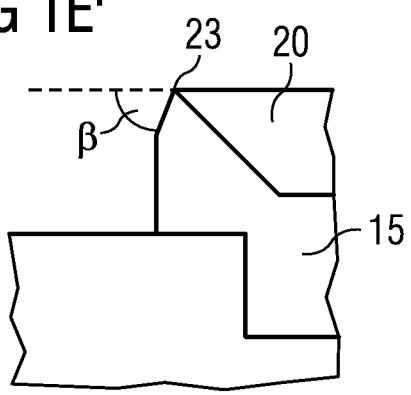

FIG. 1e illustrates the situation after the selective removal from the first auxiliary layer 15 of the regions which are not covered by the second auxiliary layer 20. The selective removal is preferably effected by means of selective etching of the material of the first auxiliary layer 15 with respect to the material of the second auxiliary layer 20. In this case, selectivity should be understood to mean a relation of the etching rates of the two different materials in a ratio of at least 10:1. In this case, by means of an isotropic etching method, the first auxiliary layer 15 can be etched at the transition from the first auxiliary layer 15 to the second auxiliary layer 20 at the well edge 23 at the surface 21 virtually perpendicularly in a direction toward the semiconductor body surface 11. This gives rise to a structure element which is composed of the first auxiliary layer 15 and the second auxiliary layer 20 and which has an edge 22 which extends in a manner proceeding from the well edge 23 at the surface 21 in a direction toward the surface 11 of the semiconductor body 10. On account of erosion of the second auxiliary layer 20, the edge 22 can also have a slightly rounded form at the well edge 23, such that the edge at the well edge 23 between the second auxiliary layer 20 and the edge 22 does not form an angle β of 90°, but rather a smaller angle β, generally an angle β in the range of from 45° to 90°, in particular between 75° and 80°. Such a rounded edge at the well edge 23 is shown in an excerpt illustration in FIG. 1E'.

Figure 2:
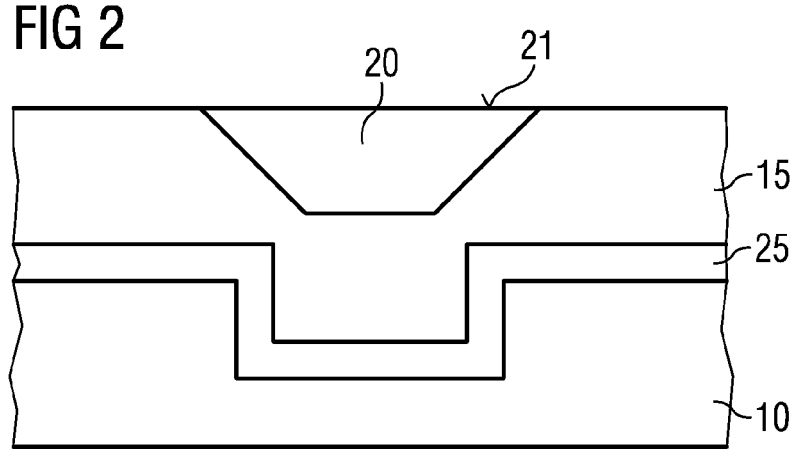
FIG. 2 shows, in a schematic cross-sectional view, a further method step in the method for producing a structure element.

FIG. 2 shows an embodiment of the method, wherein, before the production of the first auxiliary layer 15, a continuous protective layer 25 is produced on the surface 11 of the semiconductor body 10 and in the cutout 12, such that the edge at the surface 11 with respect to the sidewalls 14 of the cutout 12 is covered by the protective layer 25. As a result, this edge of the semiconductor body 10, during an exemplary HDP process for depositing the first auxiliary layer 15, is protected against removal on account of the sputtering effect of the HDP process.

Figure 3:
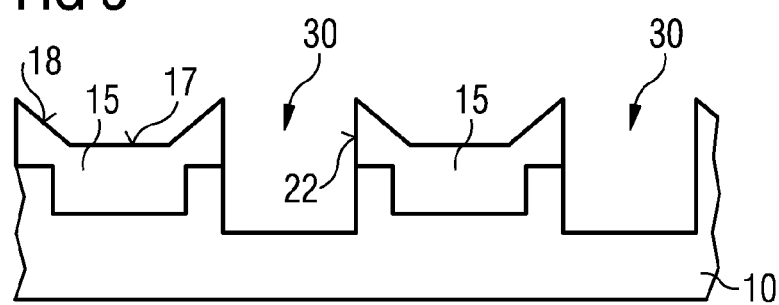
FIG. 3 shows, in a schematic cross-sectional view, an excerpt from an exemplary semiconductor component with self-aligned structure elements.

FIG. 3 shows an exemplary embodiment of the method wherein a trench 30 is produced in the semiconductor body 10 with the layer 15 as a mask layer. In this case, the trench 30 can be produced by means of an anisotropic etching process, wherein, in the case of an exemplary silicon semiconductor body 10 and a polysilicon as material for the second auxiliary layer 20, the second auxiliary layer 20 is likewise concomitantly etched and thus removed with the anisotropic etching of the trench 30, such that the well base 17 and the well sidewalls 18 are uncovered.

Figure 4:
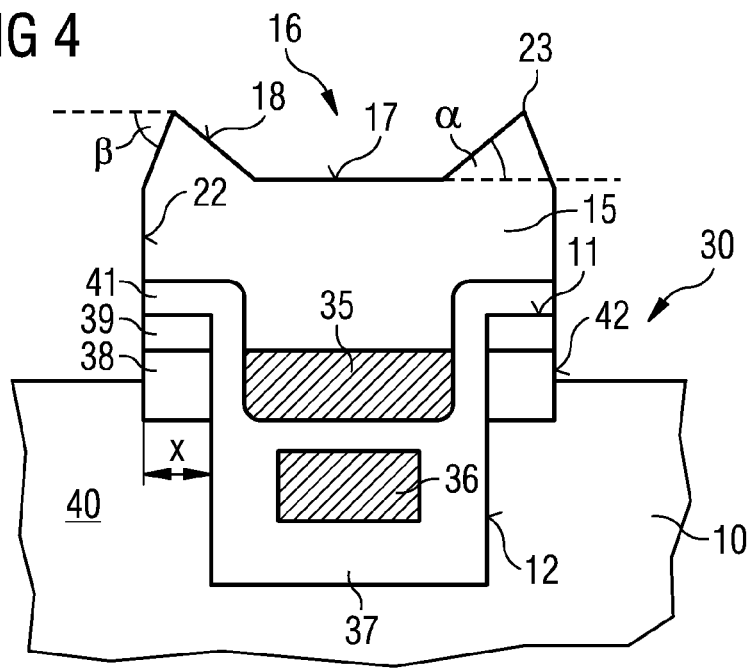
FIG. 4 shows, in a schematic cross-sectional view, an excerpt from a gate trench power transistor.

FIG. 4 illustrates an example of a semiconductor component having a gate trench as cutout 12. A field electrode 36 is formed in a lower region in the gate trench 12, the field electrode being isolated from the semiconductor body 10 by a field dielectric 37. A channel control electrode 35 is arranged in an upper region of the gate trench 12 in a manner isolated from the field electrode 36. The channel control electrode 35 is also isolated from a channel zone 38, which is formed in the semiconductor body 10, by a gate dielectric 41, for example an $SiO_2$ gate dielectric. The gate dielectric 41 is embodied such that it is thinner than the field dielectric 37. The channel zone 38 is situated along the gate trench 12 between a source zone 39 formed in the semiconductor body 10 and a drain zone 40 adjacent the field electrode 36. A layer 15 is arranged in the gate trench 12 above the channel control electrode 35, the layer 15 forming a well 16 above the gate trench 12. In this case, the well 16 has a well base 17 and well sidewalls 18 which form an angle α in the range of 20° to 80°, in particular in the range of approximately 40° to 45°, with respect to the surface 11 of the semiconductor body 10. The layer 15 is bounded by an edge 22. The edge 22 extends, in a manner proceeding from the well edge 23, in a direction toward the surface 11 of the semiconductor body 10. The layer 15 covers the surface 11 of the semiconductor body 10, proceeding from a sidewall of the gate trench 12, over a distance x for example in the range of 50 nm to 150 nm.

In the semiconductor component, as shown in the example concerning FIG. 4, a trench 30 can be formed in the semiconductor body 10. In this case, the trench 30 has a trench sidewall 42 extending into the semiconductor body 10 in a manner proceeding from the edge 22 of the layer 15. A common connection electrode for the source zone 39 and channel zone 38 can be arranged in the trench 30.

The exemplary embodiment of a semiconductor component shown as an excerpt in FIG. 4 is a MOS field effect transistor, for applications that provide voltages of from approximately 20 volts to hundreds of volts between source and drain.

The layer 15 can be produced by the method described above and serves as a mask layer for the production of the contact hole trench 30. This self-aligned layer 15 enables the contact hole trench 30 to have a very small spacing from the gate trench 12. As a result, it is possible to significantly reduce the pitch, that is to say the distance between two gate trenches 12 arranged in a parallel fashion, in comparison with previous distances. By way of example, previous solutions exhibit a pitch of approximately 950 nm, which results from the fact that the contact hole for the source/channel zone connection has to be accommodated between the two gate trenches. As a result of the self-aligned mask layer 15, the pitch can be reduced to 750 nm, for example. Consequently, the channel for the MOSFET can also be designed to be shorter, since the field does not penetrate into the channel zone to such a great extent. Moreover, the presented method steps for producing the structure element can be implemented in existing methods for producing gate trench transistors without great additional outlay.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a structure element on a surface of a semiconductor body, the method comprising:
   providing a semiconductor body having a surface;
   producing a cutout at the surface, the cutout extending from surface of the semiconductor body into the semiconductor body in a direction perpendicular to the surface, the cutout having a base, at least one sidewall and an edge at the intersection of the surface and the at least one sidewall;
   producing a first auxiliary layer on the surface of the semiconductor body and in the cutout so that the first auxiliary layer forms a well above the cutout, the well having a well base and at least one well sidewall which forms an angle $\alpha$ in the range of 20° to 80° with respect to the surface of the semiconductor body, the at least one well sidewall extending above the surface and across the edge such that a defined distance of the surface is covered by the at least one well sidewall;
   producing a second auxiliary layer within the well at the well base and at the at least one well sidewall, the first auxiliary layer and the second auxiliary layer forming a common surface at an identical surface level, the second auxiliary layer comprising a different material than the first auxiliary layer; and
   selectively removing regions of the first auxiliary layer which are not covered by the second auxiliary layer.

2. A method according to claim 1, wherein the first auxiliary layer is produced by an HDP process.

3. A method according to claim 2, wherein before the first auxiliary layer is produced, a continuous protective layer is produced on the surface of the semiconductor body and in the cutout.

4. A method according to claim 1, wherein the second auxiliary layer is produced by depositing the different material in the well.

5. A method according to claim 4, wherein the second auxiliary layer completely fills the well.

6. A method according to claim 5, wherein the common surface of the first and second auxiliary layers is produced by a CMP method.

7. A method according to claim 1, wherein the second auxiliary layer is removed from the well after the regions of the first auxiliary layer which are not covered by the second auxiliary layer are selectively removed.

8. A method according to claim 7, wherein the second auxiliary layer is removed during the production of a trench into the semiconductor body.

9. A method according to claim 8, wherein the trench has at least one trench sidewall which, proceeding from an edge of the first auxiliary layer, extends into the semiconductor body.

10. A method according to claim 1, wherein the at least one well sidewall extends across the edge such that the first auxiliary layer covers the surface by a distance of 50 nm to 150 nm.

11. A method according to claim 1, wherein the first auxiliary layer has an edge which, proceeding from an edge of the well, extends in the direction of the surface of the semiconductor body.

12. A method according to claim 11, wherein the edge of the first auxiliary layer is rounded at the well edge such that the edge of the first auxiliary layer at the well edge between the second auxiliary layer and the edge forms an angle $\alpha$ of less than 90°.

* * * * *